United States Patent
Kang

(10) Patent No.: US 7,120,043 B2
(45) Date of Patent: Oct. 10, 2006

(54) FERAM HAVING SINGLE ENDED SENSING ARCHITECTURE

(75) Inventor: Hee Bok Kang, Daejeon (KR)

(73) Assignee: Hynix Semicondutor Inc., Gyeonggi-do (KR)

( * ) Notice: Subject to any disclaimer, the term of this patent is extended or adjusted under 35 U.S.C. 154(b) by 0 days.

(21) Appl. No.: 10/879,188

(22) Filed: Jun. 30, 2004

(65) Prior Publication Data

US 2005/0117380 A1 Jun. 2, 2005

(30) Foreign Application Priority Data

Nov. 27, 2003 (KR) .................. 10-2003-0084794

(51) Int. Cl.
*G11C 11/22* (2006.01)

(52) U.S. Cl. .................. 365/145; 365/189.11; 365/191

(58) Field of Classification Search .................. 365/145
See application file for complete search history.

(56) References Cited

U.S. PATENT DOCUMENTS 6,272,594 B1    8/2001   Gupta et al.
6,363,439 B1    3/2002   Battles et al.
6,665,203 B1 *  12/2003  Fujisawa et al. .............. 365/51
6,809,949 B1 * 10/2004  Ho .............................. 365/145
2003/0206430 A1  11/2003 Ho

FOREIGN PATENT DOCUMENTS

JP    2002-015578    1/2002

* cited by examiner

*Primary Examiner*—Amir Zarabian
*Assistant Examiner*—Kretelia Graham
(74) *Attorney, Agent, or Firm*—Heller Ehrman LLP

(57) ABSTRACT

A nonvolatile ferroelectric memory device has a single-ended sensing structure. The nonvolatile ferroelectric memory device comprises a plurality of cell array blocks, a plurality of sense amplifiers, a main amplifier unit and a data bus. The sense amplifier unit sets a voltage of a main bit line to a predetermined sensing level before cell data are transmitted to the main bit line, and then senses data by comparing the voltage of the main bit line with the sensing level when cell data are transmitted. Additionally, a data bus which is divided into a local data bus and a global data bus transmits the sensed data, thereby improving the sensing speed and the sensing margin.

9 Claims, 10 Drawing Sheets

FERAM HAVING SINGLE ENDED SENSING ARCHITECTURE

BACKGROUND OF THE INVENTION

1. Field of the Invention

The present invention generally relates to a nonvolatile ferroelectric memory device, and more specifically, to a nonvolatile ferroelectric memory device configured to improve the sensing speed and the sensing voltage margin by improving a structure of a sense amplifier for sensing a voltage of a main bit line and a structure of data bus for transmitting data sensed in the sense amplifier.

2. Description of the Prior Art

Generally, a ferroelectric random access memory (hereinafter, referred to as 'FeRAM') has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 1998-14400 by the same inventor of the present invention. Therefore, the basic structure and the operation on the FeRAM are not described herein.

As the chip operation voltage of the FeRAM becomes lower, the cell sensing voltage also decreases. As a result, it is difficult to embody the rapid operation speed in a FeRAM chip having a 1T1C (1-Transistor 1-Capacitor) structure.

Specifically, when the sensing voltage of cell data is small, it is difficult to sense cell data due to the small voltage margin for sensing timing.

SUMMARY OF THE INVENTION

Accordingly, it is an object of the present invention to improve the sensing speed and the sensing voltage margin by improving structures of a sense amplifier and a data bus.

In an embodiment, a nonvolatile ferroelectric memory device comprises a plurality of cell array blocks, a plurality of sense amplifiers, a main amplifier unit and a data bus. Each of the plurality of cell array blocks comprises a dummy main bit line and a cell array having a hierarchical bit line architecture where a sensing voltage of a main bit line is induced depending on a sensing voltage of cell data transmitted to a sub bit line. The plurality of sense amplifier units sense a voltage of the dummy main bit line, regulate a pull-up voltage of the main bit line depending the sensed voltage and set the voltage of the main bit line to a predetermined sensing level which becomes a basis of cell data decision when a sensing operation starts, and compares the sensing level with a voltage of the main bit line to sense the cell data when data are sensed. The main amplifier unit amplifies data sensed by the sense amplifier unit and outputs the sensed data to a data buffer. The data bus connects the sense amplifiers to the main amplifier unit and transmits read or written data.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
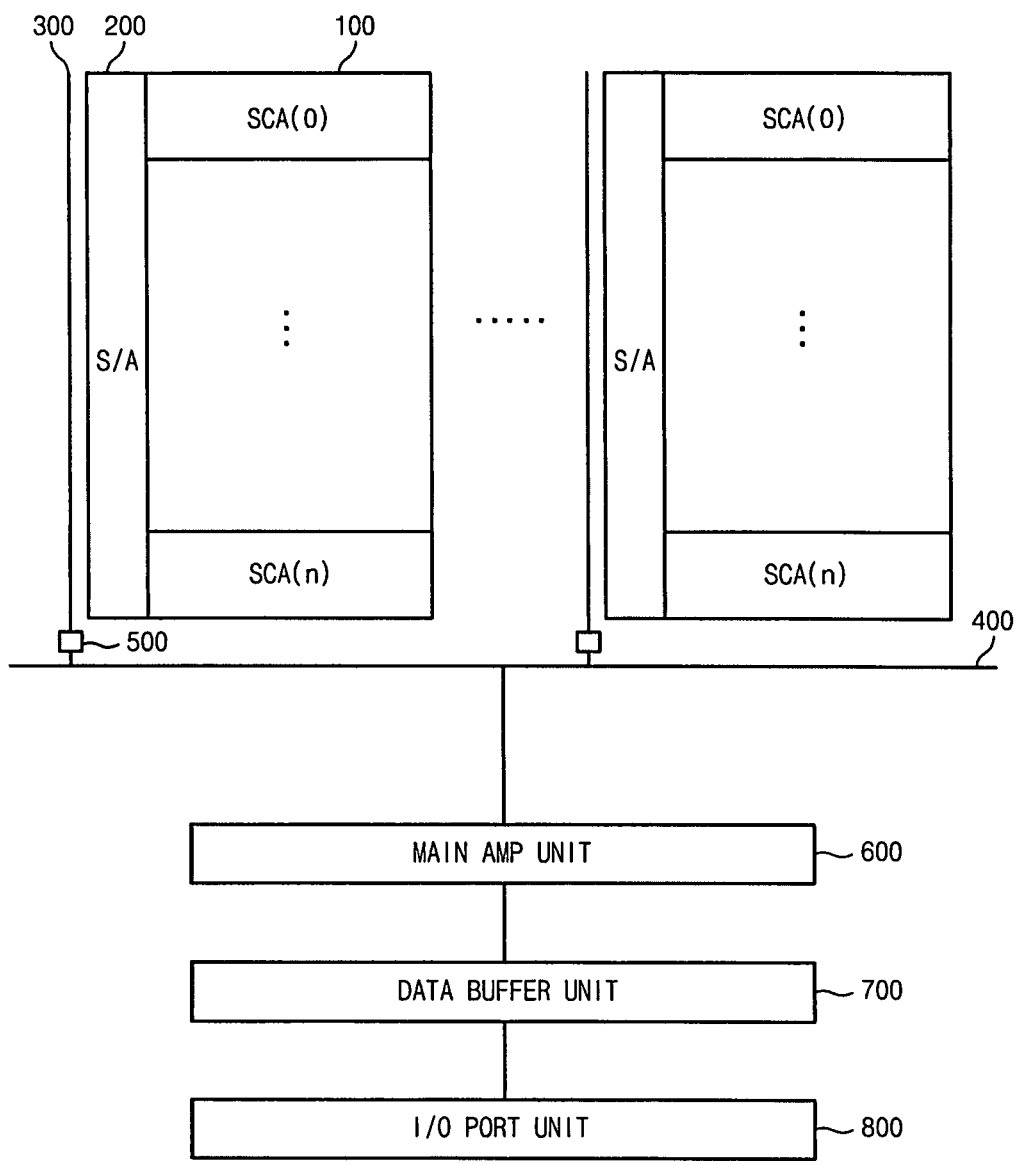
FIG. 1 is a diagram illustrating a structure of a nonvolatile ferroelectric memory device according to a first embodiment of the present invention.

FIG. 1 is a diagram illustrating a structure of a nonvolatile ferroelectric memory device according to a first embodiment of the present invention.

In an embodiment, the nonvolatile ferroelectric memory device comprises a plurality of cell array blocks 100, a plurality of sense amplifier units 200, a plurality of local data buses 300, a global data bus 400, a plurality of data bus switches 500, a main amplifier unit 600 and a data buffer 700.

The cell array block 100 comprises a plurality of sub cell arrays SCA(0).about.SCA(n). Each sub cell array SCA(0).about.SCA(n) comprises cell arrays for storing data. Specifically, the cell array block 100 comprises a hierarchical bit line structure including sub bit lines and main bit lines for inducing a sensing voltage of the main bit line by regulating the amount of current leaked from the main bit line depending on a sensing voltage of the sub bit line. Here, the sub bit line is located in each sub cell array SCA(0).about.SCA(n), and the main bit line is located to be shared in the whole sub cell arrays SCA(0).about.SCA(n).

The sense amplifier unit 200 senses and amplifies the sensing voltage of the main bit line, and selectively outputs the amplified voltage to the local data bus 300. The sense amplifier unit 200 transmits write data applied through the local data bus 300 to the main bit line of the cell array block 100. The sense amplifier unit 200 is located between the cell array block 100 and the local data bus 300 to correspond one by one to the cell array block 100, and one of the input/output terminals of the sense amplifier unit 200 is connected to the main bit line. In other words, the sense amplifier unit 200 according to an embodiment of the present invention directly is connected to a main bit line not through the common data bus and senses the sensing voltage of the main bit line while a conventional sense amplifier is connected to a main bit line through a common data bus and senses applied cell data.

The local data bus 300 transmits the sensing voltage (read data) sensed by the sense amplifier unit 200 to the global data bus 400, and transmits write data applied through the global data bus 400 to the sense amplifier unit 200. The local data bus 300 is located at one side of the sense amplifier unit 200 to correspond one by one to the cell array block 100. The local data bus 300 comprises a predetermined number of bus lines corresponding to the number of data inputted or outputted simultaneously.

Each local data bus 300 selectively connected to the global data bus 400 depending on on/off operations of the data bus switch 500 shares the global data bus 400.

The global data bus 400 transmits the read data applied from the local data bus 300 to the main amplifier 600, and transmits the write data applied from the main amplifier 600 to the local data bus 300. The global data bus 400 is selectively connected to one of the plurality of local data buses 300 depending on on/off operations of the data bus switch 500.

The main amplifier 600 amplifies the read data applied from the global data bus 400 and transmits the amplified data to the data buffer 700, and amplifies the write data applied through the data buffer 700 and transmits the amplified data to the global data bus 400.

The data buffer 700 buffers the read data to be outputted externally and transmits the buffered data to an I/O port 800, and then buffers the write data inputted externally and transmits the buffered data to the main amplifier 600.

Figure 2:
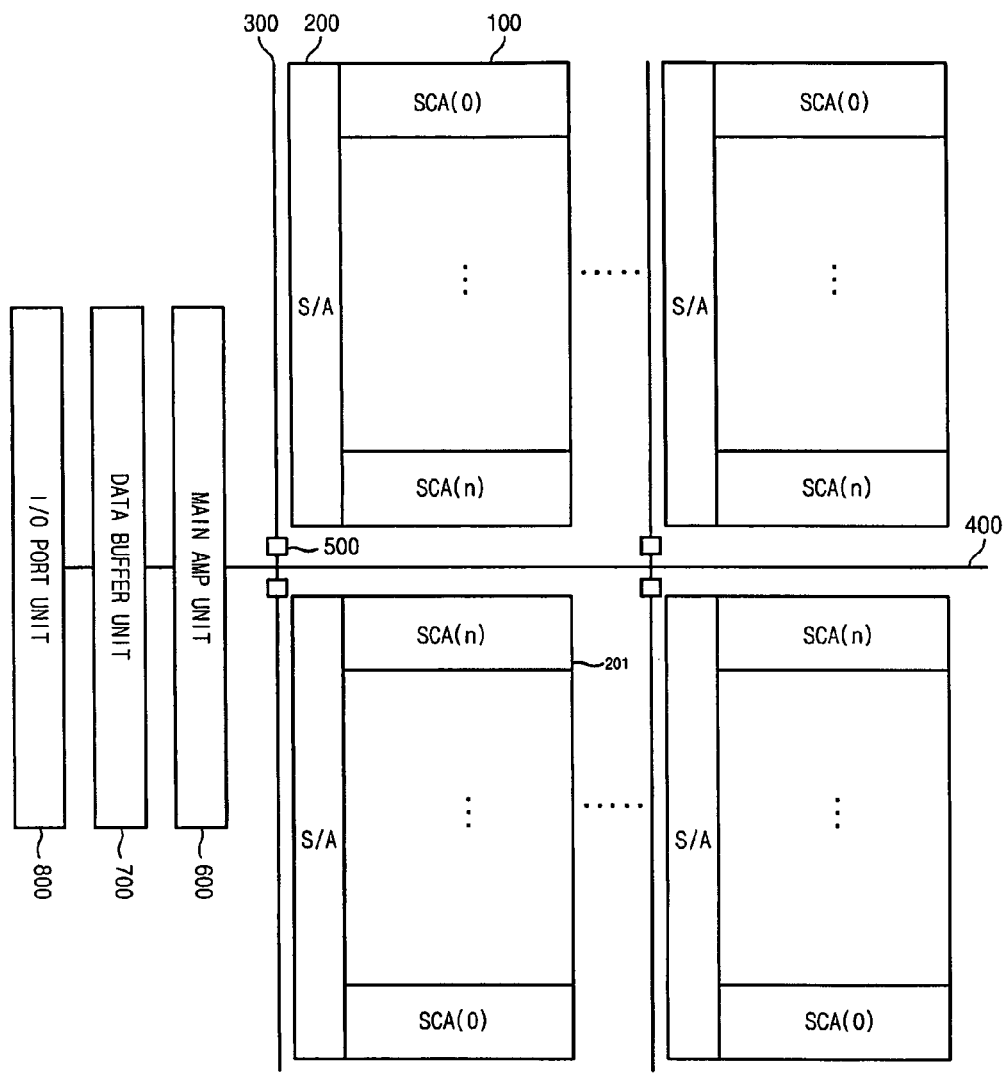
FIG. 2 is a diagram illustrating a nonvolatile ferroelectric memory device according to a second embodiment of the present invention.

FIG. 2 is a diagram illustrating a nonvolatile ferroelectric memory device according to a second embodiment of the present invention.

In the nonvolatile ferroelectric memory device of FIG. 2, cell array blocks 100 are arranged symmetrically around the global data bus 400. In each cell array block 100 of FIG. 2, the sense amplifier units 200 correspond one by one to the local data buses 300 like that in FIG. 1.

The global data bus 400 is shared in the local data buses located up and down through the data bus switch 500.

The other structure and functions of each element are the same as those of FIG. 1.

Figure 3:
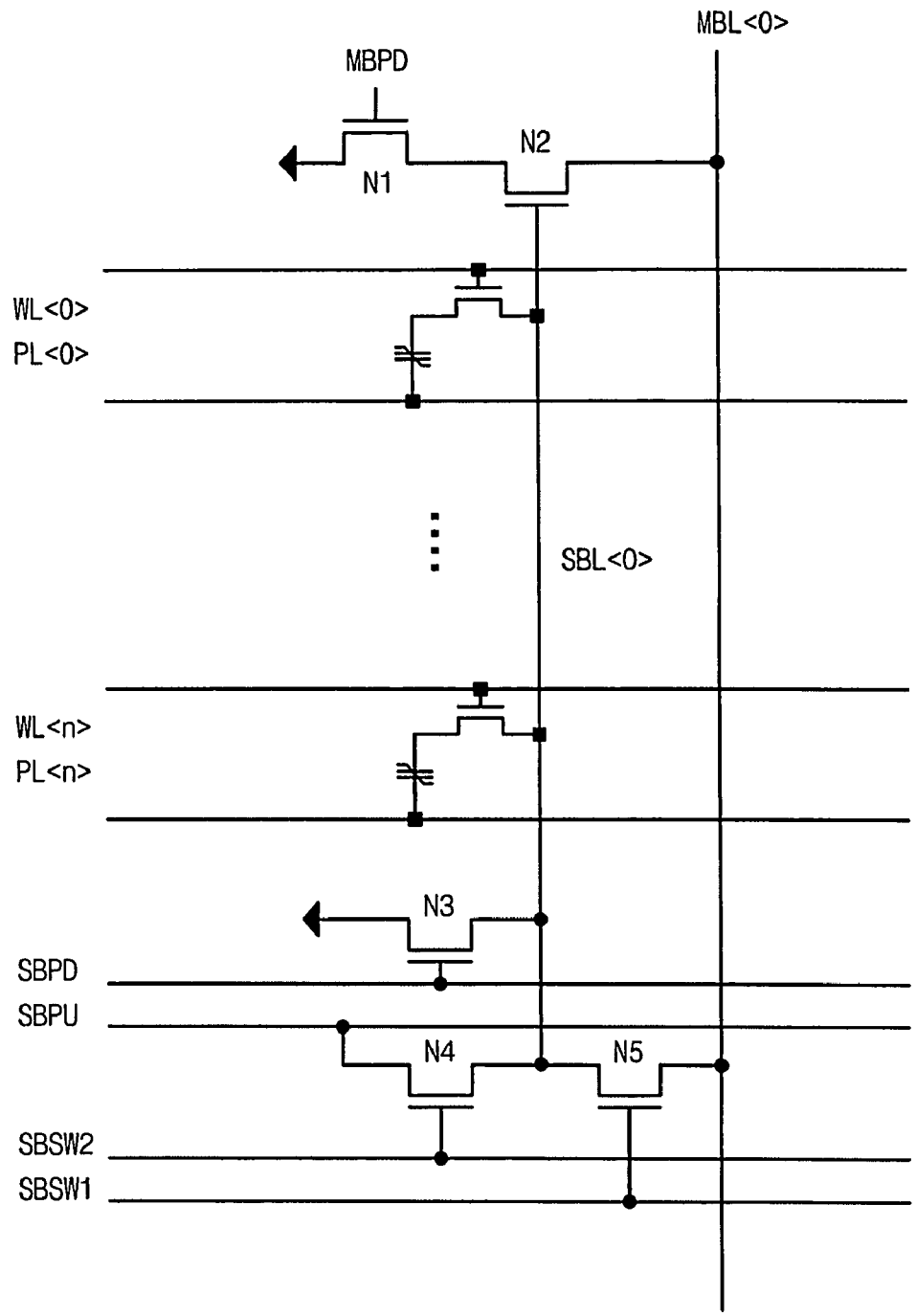
FIG. 3 is a circuit diagram illustrating a structure of a unit cell array of sub cell arrays in a cell array block of FIGS. 1 and 2.

FIG. 3 is a circuit diagram illustrating the structure of the unit cell array SCA(0) of sub cell arrays SCA(0).about.SCA(n) in the cell array block 100 of FIGS. 1 and 2.

In the cell array block 100, a main bit line MBL corresponds in parallel to a plurality of sub bit lines SBL<0>.about.SBL<n>. The main bit line MBL is selectively connected to one sub bit line SBL in every operation. FIG. 3 shows the connection relationship between the sub bit line SBL<0> included in the sub cell array SCA(0) and the main bit line MBL<0>.

If a sub bit line selecting signal SBSW1 is activated, a NMOS transistor N5 is turned on. As a result, load of the main bit line MBL<0> is adjusted to a level of one sub bit line SBL. If a sub bit line pull-down signal SBPD is activated to turn on a NMOS transistor N3, the sub bit line SBL<0> is adjusted to a ground voltage level.

The sub bit line pull-up signal SBPU regulates power to be supplied to the sub bit line SBL<0>. A sub bit line selecting signal SBSW2 regulates signal flow between the sub bit line pull-up signal SBPU and the sub bit line SBL<0>.

To generate a high voltage in the sub bit line SBL<0>, a voltage higher than the power voltage is to be supplied as the sub bit line pull-up signal SBPU. Next, if the sub bit line selecting signal SBSW2 is activated to turn on a NMOS transistor N4, a high voltage is supplied to the sub bit line SDL<0>. A plurality of cells are connected to the sub bit line SBL<0>.

A NMOS transistor N1, connected between a ground voltage and a NMOS transistor N2, has a gate to receive a main bit line pull-down signal MBPD. The NMOS transistor N2, connected between the NMOS transistor N1 and the main bit line MBL<0>, has a gate connected to the sub bit line SBL<0>. When the main bit line pull-down signal MBPD is activated and a sensing voltage is applied to the sub bit line SBL<0>, the NMOS transistor N2 is turned on by the sensing voltage. Here, channel resistance of the NMOS transistor N2 is changed by the sensing voltage depending on cell data so that the amount of current leaked through the NMOS transistor N2 is differentiated. In this way, the sensing voltage of the main bit line MBL<0> is induced by the difference in the amount of current leaked through the NMOS transistor N2.

Figure 4:
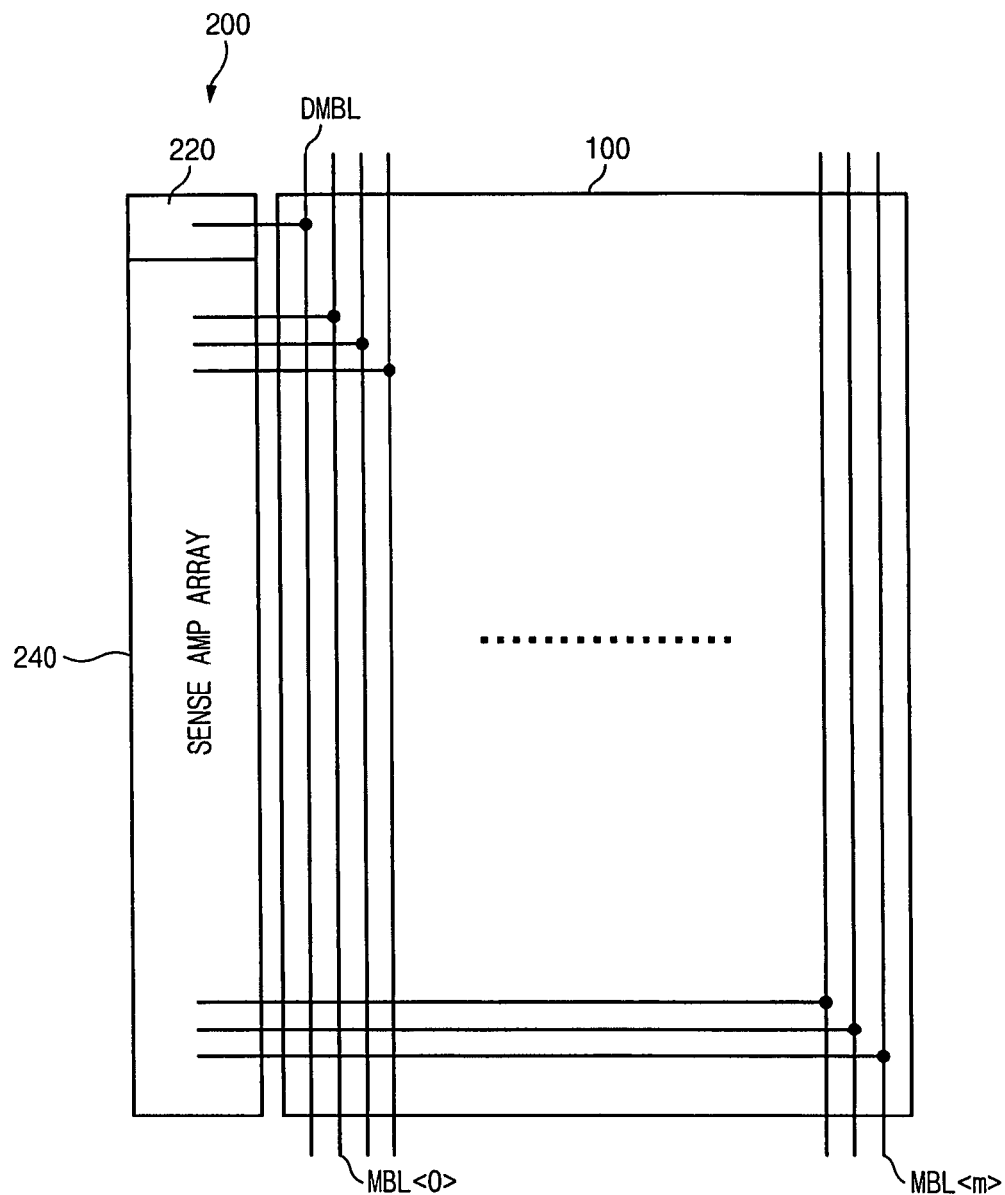
FIG. 4 is a diagram illustrating a sense amplifier unit connected to main bit lines in a cell array block.

FIG. 4 is a diagram illustrating the sense amplifier unit connected to main bit lines in the cell array block 100.

Each cell array block 100 comprises a dummy main bit line DMBL located parallel with a plurality of main bit lines MBL<0>.about.MBL<m>.

The sense amplifier unit 200 comprises a sensing voltage pull-up regulating unit 200 and a sense amplifier array 240.

The dummy main bit line DMBL is connected to the sensing voltage pull-up regulating unit 220, and the main bit lines MBL<0>.about.MBL<m> are connected to the sense amplifier array 240. Here, the dummy main bit line DMBL is configured to have the same load condition as that of the main bit line MBL (C.sub.DMBL.apprxeq.C.sub.MBL)

The sensing voltage pull-up regulating unit 220 and the dummy main bit line DMBL pulls up a voltage of the main bit line MBL not to a power voltage VCC but to a predetermined level (hereinafter, referred to as "sensing level") lower than the power voltage at the initial sensing operation, thereby reducing sensing time.

The sense amplifier array 240 senses the sensing voltage of the main bit line MBL, and transmits the sensed read data to the local data bus 300 in response to a column selecting signal. Then, the sense amplifier array 240 retransmits the read data for restoration to the main bit line MBL. The sense amplifier array 240 transmits the write data applied through the local data bus 300 to the main bit line MBL.

Figure 5:
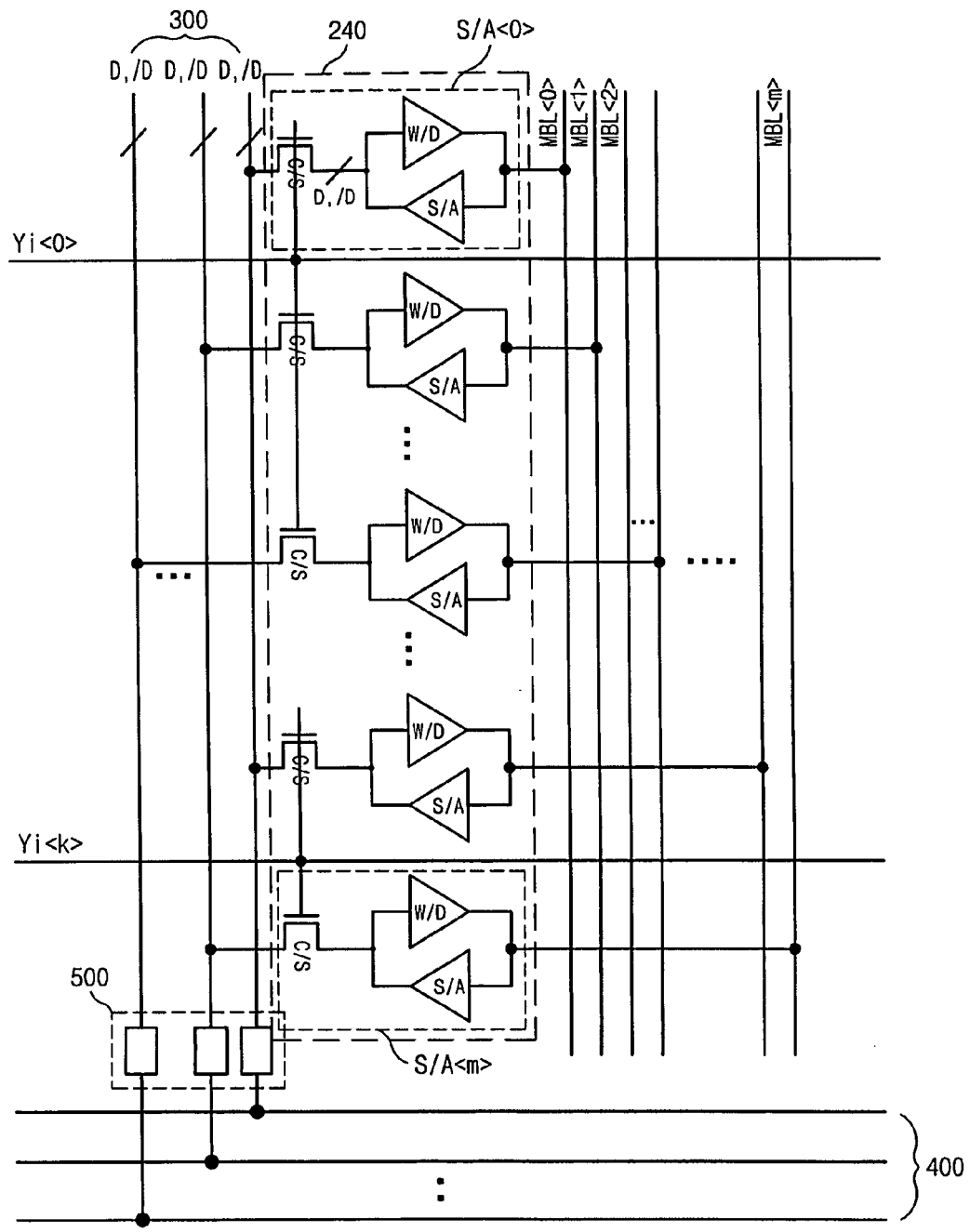
FIG. 5 is a diagram illustrating the structure of a sense amplifier array and a data bus.

FIG. 5 is a diagram illustrating the structure of the sense amplifier array 240 and the data bus.

The sense amplifier array 240 comprises a plurality of sense amplifiers S/A<0>.about.S/A<m> corresponding one by one to the main bit lines MBL<0>.about.MBL<m>. One input/output terminal of each sense amplifier S/A<0>.about.S/A<m> is connected to the main bit lines MBL<0>.about.MBL<m>, and the other input/output terminal is connected to the local data bus 300.

In a read mode, each sense amplifier S/A<0>.about.S/A<m>-; senses the sensing voltage of the main bit line MBL<0>.about.MBL&l-t;m>, and outputs the read data to the local data bus 300 in response to the column selecting signal Yi<0>.about.Yi<k>. The sense amplifier S/A<0>.about.S/A<m> retransmits the sensed read data to the corresponding main bit line MBL for restoration.

In a write mode, each sense amplifier S/A<0>.about.S/A<m&g-t; transmits the write data applied from the local data bus 300 to the main bit line MBL<0>.aboutMBL<m> in response to the column selecting signal Yi<0>.about.Yi<k>. Here, the number of sense amplifiers connected to one column selecting signal Yi<0>.about.Yi<k> corresponds to that of data simultaneously inputted or outputted by one column selection.

The local data bus 300 is selectively connected to the global data bus 400 through the data bus switch 500.

Figure 6:
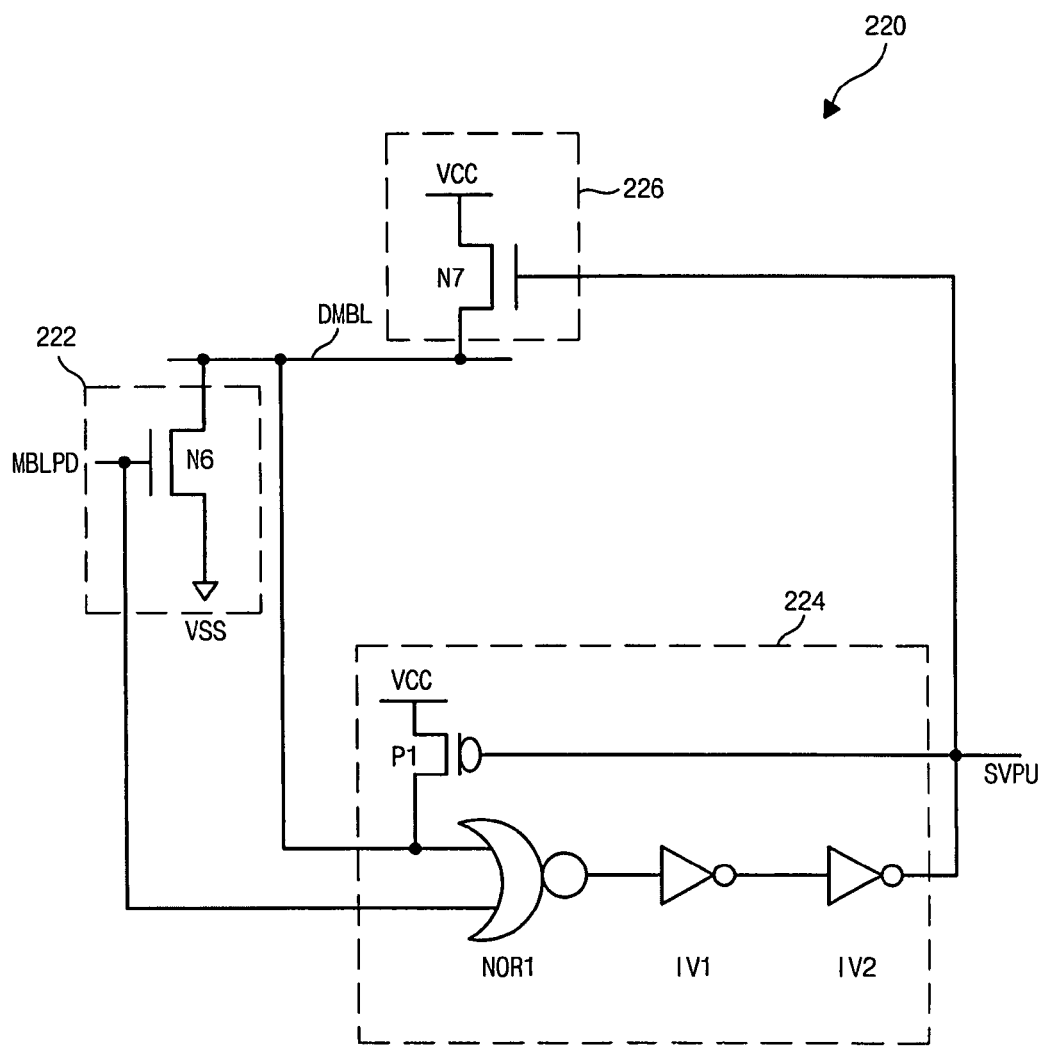
FIG. 6 is a circuit diagram illustrating a sensing voltage pull-up regulating unit of FIG. 4.

FIG. 6 is a circuit diagram illustrating the sensing voltage pull-up regulating unit 220 of FIG. 4.

The sensing voltage pull-up regulating unit 220 comprises a dummy sensing voltage pull-down unit 222, a pull-up control unit 224 and a dummy sensing voltage pull-up unit 226.

The dummy sensing voltage pull-down unit 222 pulls down the dummy main bit line DMBL to a ground voltage level in response to a main bit line pull-down control signal MBLPD when the sensing operation starts.

The dummy sensing voltage pull-down unit 222 comprises a NMOS transistor N6. The NMOS transistor N6, connected between the dummy main bit line DMBL and the ground voltage VSS, has a gate to receive the main bit line pull-down control signal MBLPD.

The pull-up control unit 224 controls the pull-up operation of the dummy main bit line DMBL and the main bit line MBL depending on the main bit line pull-down control signal MBLPD and the voltage level of the dummy main bit line DMBL. That is, when the main bit line pull-down control signal MBLPD is inactivated and the voltage of the dummy main bit line DMBL is smaller than the sensing level, the pull-up control unit 224 activates a sensing voltage pull-up signal SVPU for pulling up the dummy main bit line DMBL and the main bit line MBL. Then, the pull-up control unit 224 inactivates the sensing voltage pull-up signal SVPU if the voltage level of the dummy main bit line DMBL is higher than the sensing level. Here, although the sensing voltage pull-up signal SVPU is inactivated, the pull-up control unit 224 continuously pulls up the dummy main bit line DMBL to the power voltage VCC level so that the sensing voltage pull-up signal SVPU can be stably maintained at a low level.

The pull-up control unit 224 comprises a NOR gate NOR1, inverters IV1 and IV2, and a PMOS transistor P1. The NOR gate NOR1 performs a NOR operation on the main bit line pull-down control signal MBLPD and the sensing voltage of the dummy main bit line DMBL. The inverter IV1 inverts an output signal from the NOR gate NOR1, and inverter IV2 outputs the sensing voltage pull-up signal SVPU by inverting an output signal from the inverter IV1. The PMOS transistor P1, connected between the power voltage VCC and the dummy main bit line DMBL, has a gate to receive the sensing voltage pull-up signal SVPU. Here, the size of the NMOS transistor N6 is larger than that of the PMOS transistor P1.

The sensing voltage pull-up signal SVPU outputted from the NOR gate NOR1 is transited from 'high' to 'low' when the main bit line pull-down control signal MBLPD is inactivated and the sensing voltage of the dummy main bit line DMBL rises over a predetermined level. As a result, the sensing level can be regulated by control of the size of the NOR gate NOR1.

The dummy sensing voltage pull-up unit 226 pulls up the dummy main bit line DMBL when the sensing voltage pull-up signal SVPU is activated.

The dummy sensing voltage pull-up unit 226 comprises a NMOS transistor N7. The NMOS transistor N7, connected between the power voltage VCC and the dummy main bit line DMBL, has a gate to receive the sensing voltage pull-up signal SVPU.

Figure 7:
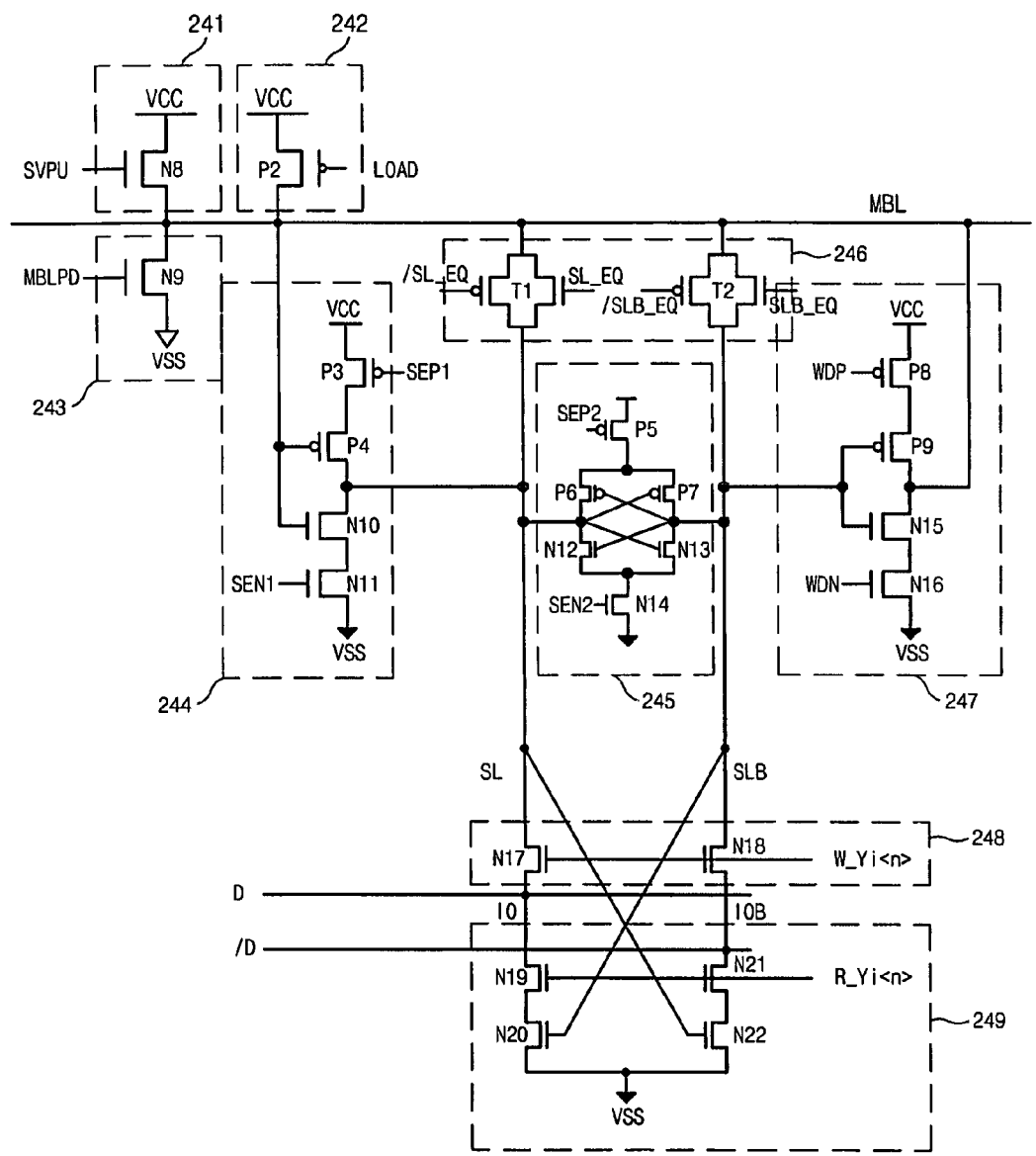
FIG. 7 is a circuit diagram illustrating a sense amplifier of FIG. 5.

FIG. 7 is a circuit diagram illustrating the sense amplifier S/A<0>.about.S/A<m> of FIG. 5.

Each sense amplifier S/A<0>.about.S/A<m> comprises a sensing voltage pull-up unit 241, a sensing load unit 242, a sensing voltage pull-down unit 243, a single-ended amplifier unit 244, a data latch unit 245, a voltage equivalent unit 246, a write driving unit 247, a write selecting unit 248 and a read selecting unit 249.

The sensing voltage pull-up unit 241 pulls up the main bit line MBL when the sensing voltage pull-up signal SVPU is activated.

The sensing voltage pull-up unit 241 comprises a NMOS transistor N8. The NMOS transistor N8, connected between the power voltage VCC and the main bit line MBL, has a gate to receive the sensing voltage pull-up signal SVPU.

The sensing load unit 242 controls the sensing load of the main bit line MBL in response to a sensing load signal LOAD.

The sensing load unit 242 comprises a PMOS transistor P2. The PMOS transistor P2, connected between the power voltage VCC and the main bit line MBL, has a gate to receive the sensing load signal LOAD.

The sensing voltage pull-down unit 243 pulls down the main bit line MBL to the ground voltage VSS level in response to the main bit line pull-down control signal MBLPD when the sensing operation starts.

The sensing voltage pull-down unit 243 comprises a NMOS transistor N9. The NMOS transistor N9, connected between the main bit line MBL and the ground voltage VSS, has a gate to receive the main bit line pull-down control signal MBLPD.

The single-ended amplifier unit 244 is activated in response to sensing control signals SEN1 and SEP1, and senses the sensing voltage of the main bit line MBL. Here, the single-ended amplifier unit 244 receives the sensing voltage of the main bit line MBL as single input, and outputs a low level signal if the sensing voltage is larger than the sensing level and a high level signal if the sensing voltage is lower than the sensing level. That is, the single-ended amplifier unit 244 is configured to have the same logic decision voltage as the sensing level.

The single-ended amplifier unit 244 comprises PMOS transistor P3 and P4 connected serially between the power voltage VCC and a node SL, and NMOS transistor N10 and N11 connected serially between the node SL and the ground voltage VSS. A gate of the PMOS transistor P3 receives the sensing control signal SEP1, and a gate of the NMOS transistor N11 receives the sensing control signal SEN1. A gate of the PMOS transistor P4 and a gate of the NMOS transistor N10 are connected in common to the main bit line MBL.

The data latch unit 245 is activated in response to the sensing control signals SEN2 and SEP2, and stores output signals (read data) from the single-ended amplifier unit 244 or signals (write data) applied through the local data bus 300.

The data latch unit 245 comprises PMOS transistors P6 and P7 having a cross-coupled latch circuit structure, NMOS transistors N12 and N13, and a PMOS transistor P5 and a NMOS transistor N14 which activate a latch circuit when the sensing control signals SEP2 and SEN2 are activated.

The voltage equivalent unit 246 equalizes voltages of both ends of the data latch unit 245 with the voltage of the main bit line MBL before the sensing control signals SEN and SEP2 are activated.

The voltage equivalent unit 246 comprises transmission gates T1 and T2. The transmission gate T1, connected between the main bit line MBL and the node SL, is turned on/off in response to control signals SL_EQ and /SL_EQ. The transmission gate T2, connected between the main bit line MBL and a node SLB, is turned on/off in response to control signals SLB_EQ and /SLB_EQ.

The write driving unit 247 is activated in response to write control signals WDN and WDP when data are written or restored, and transmits data stored in the data latch unit 245 to the main bit line MBL.

The write driving unit 247 comprises PMOS transistors P8 and P9 connected serially between the power voltage VCC and the main bit line MBL, and NMOS transistors N15 and N16 connected between the main bit line MBL and the ground voltage VSS. Here, a gate of the PMOS transistor P8 receives the write control signal WDP, and a gate of the NMOS transistor N16 receives the write control signal WDN. Gates of the PMOS transistor P9 and the NMOS transistor N115 are connected in common to the node SLB.

The write selecting unit 248 transmits write data D and /D applied from the local data bus 300 to the data latch unit 245 in response to a write column selecting signal W_Yi<n>.

The write selecting unit 248 comprises NMOS transistors N17 and N18. The NMOS transistor N17, connected between the node SL and an input/output terminal IO, has a gate to receive the write column selecting signal W_Yi<n>. The NMOS transistor N 18, connected between the node SLB and an input/output terminal 10B, has a gate to receive the write column selecting signal W_Yi<n>.

The read selecting unit 249 transmits the data D and /D stored in the data latch unit 245 to the local data bus 300 in response to a read column selecting signal R_Yi<n>.

The read selecting unit 249 comprises NMOS transistors N19 and N20 connected serially between the input/output node 10 and the ground voltage VSS, and NMOS transistors N21 and N22 connected serially between the input/output node 10B and the ground voltage VSS. Here, gates of the NMOS transistors N19 and N21 receive the read column selecting signal R_Yi<n>, and gates of the NMOS transistors N20 and N22 are connected to the nodes SLB and SL, respectively.

Figure 8:
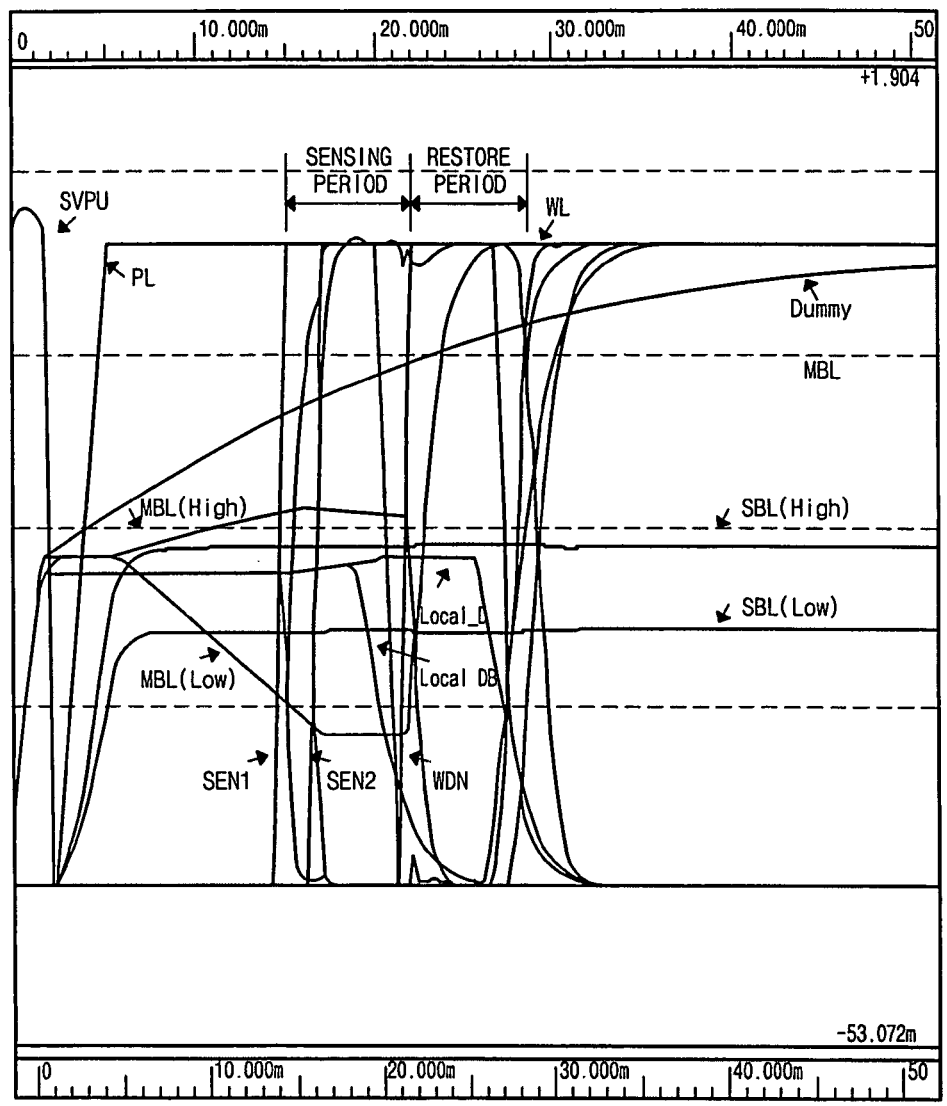
FIG. 8 is a diagram illustrating the operation waveform when data are sensed according to an embodiment of the present invention.

FIG. 8 is a diagram illustrating the operation waveform when data are sensed according to an embodiment of the present invention.

The voltage of the dummy main bit line DMBL pulled down by the dummy sensing voltage pull-down unit 222 is gradually pulled up by the sensing voltage pull-up unit 226 when the sensing voltage pull-up signal SVPU is activated. Here, since the dummy main bit line DMBL has the same load condition as that of the main bit lines MBL, the voltage of the main bit line MBL increases equally with that of the dummy main bit line DMBL.

If the voltage of the dummy main bit line DMBL reaches the sensing level, the sensing voltage pull-up signal SVPU is transited to 'low' by the NOR gate NOR1. Due to transition of the sensing voltage pull-up signal SVPU, the voltage of the main bit line MBL stops rising and is set to the sensing level. However, the voltage of the dummy main bit line DMBL continuously rises to the power voltage VCC by the PMOS transistor P1. In this way, the stability of the sensing voltage pull-up signal SVPU can be secured by continuously increasing the voltage of the dummy main bit line DMBL. As a result, the voltage level of the dummy main bit line DMBL becomes different from that of the main bit line herefrom.

Then, if a word line WL and a plate line PL are activated and cell data are transmitted to the sub bit line SBL, the voltage of the main bit line MBL moves up or down on a basis of the sensing level voltage. That is, the sensing voltage of the main bit line MBL moves downward if the cell data is 'high', and upward if the cell data is 'low'.

If the sensing voltage of the main bit line MBL is sufficiently changed, the sensing control signals SEN1 and SEP1 are activated. As a result, the single-ended amplifier 244 is operated to sense the sensing voltage of the main bit line MBL. Here, the single-ended amplifier 244 is configured to have the same logic decision voltage as the sensing level, thereby securing the sufficient sensing voltage margin.

If the operation of the single-ended amplifier 244 is completed, the sensing control signal SEN2 is activated, and the data sensed and amplified in the single-ended amplifier 244 are stored in the data latch unit 245. The stored data D and /D are transmitted to the local data bus 300 in response to the read column selecting signal R_Yi<n>, and then restored in response to the write control signals WDN and WDP.

Figure 9:
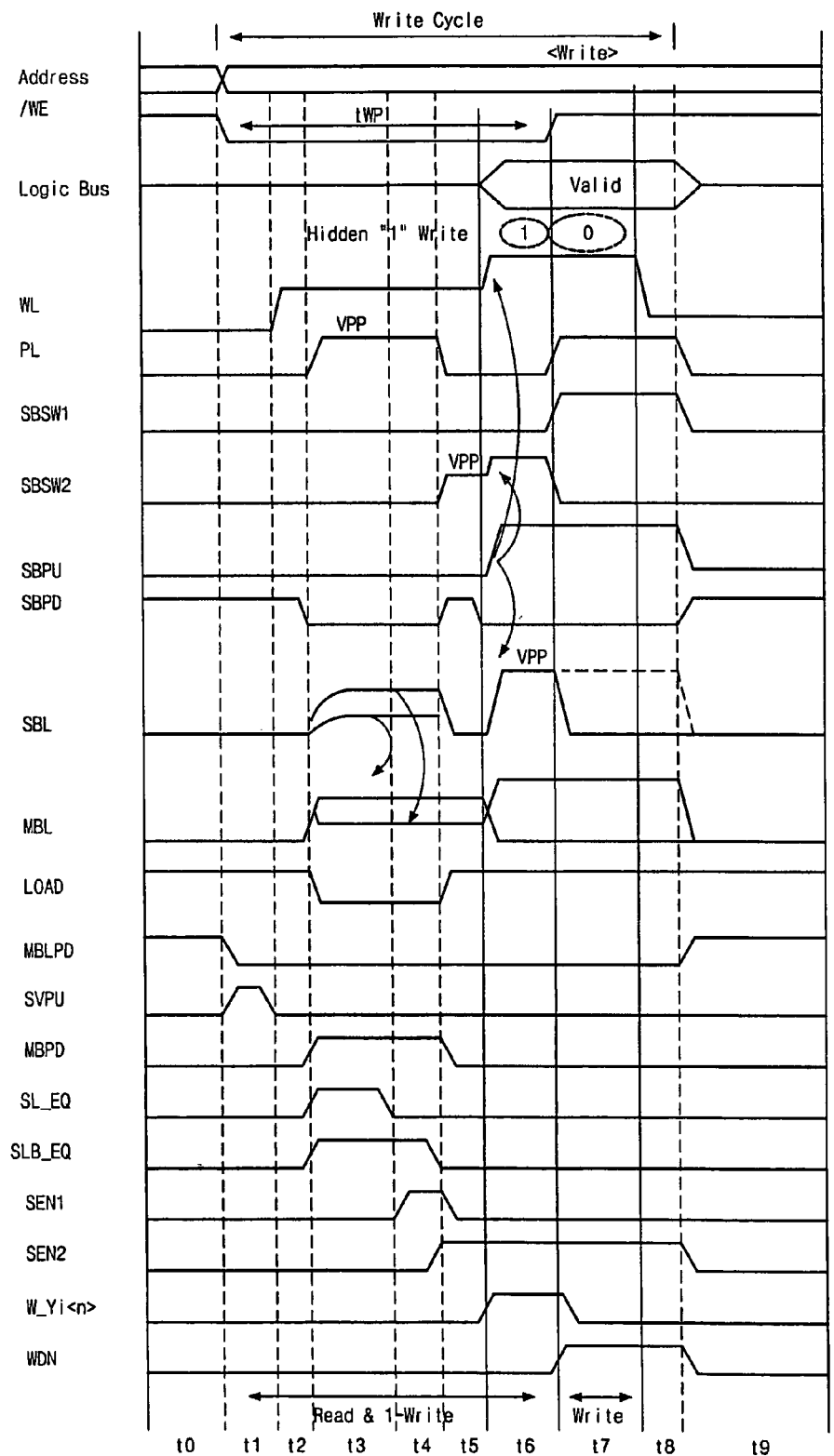
FIG. 9 is a timing diagram illustrating the write operation of the nonvolatile ferroelectric memory device according to an embodiment of the present invention.

FIG. 9 is a timing diagram illustrating the write operation of the nonvolatile ferroelectric memory device according to an embodiment of the present invention.

In an interval t0, if an address signal is transited and a write enable signal /WE is inactivated to 'low', the write mode becomes active. In the interval t0, the main bit line pull-down control signal MBLPD is activated, the dummy main bit line DMBL and the main bit line MBL are pulled down simultaneously, as shown in FIG. 6. Here, the sub bit line SBL is pulled down in response to the sub bit line pull-down signal SBPD.

Intervals t1 and t2 are pulled up periods. In the interval t1, if the main bit line pull-down control signal MBLPD is inactivated, the sensing voltage pull-up signal SVPU is transited to 'high' and the voltages of the dummy main bit line DMBL and the main bit line MBL rise equally, as shown in FIG. 6. Here, if the voltage of the dummy main bit line DMBL reaches to the sensing level, the sensing voltage pull-up signal SVPU is transited to 'low', as shown in FIG. 6. Due to the transition of the sensing voltage pull-up signal SVPU, the voltage of the main bit line MBL is no more pulled up but is set to the sensing level. However, the voltage of the dummy main bit line DMBL continuously rises to the power voltage VCC by the PMOS transistor P1, as shown in FIG. 6.

In the interval t2, the word line WL is enabled, and the sub bit line pull-down signal SBPD is disabled to 'low'. As a result, the storage node of the cell is initialized to the ground level. Here, the word line WL is activated earlier than the plate line PL for a predetermined time to stabilize the state of the cell storage node at the initial operation, thereby improving the sensing margin.

During intervals t3 and t4, data are sensed. In the interval t3, the plate line PL is activated to a pumping voltage VPP level, and cell data are applied to the main bit line MBL. The control signals SL_EQ and SLB_EQ are activated before the sensing control signals SEN1 and SEP1 are activated so that the voltages of both ends of the data latch unit 245 become the same as that of the main bit line MBL.

In the interval t4, if the sensing control signals SEN1 and SEP1 are activated to 'high', the single-ended amplifier 244 senses data of the main bit line MBL. The sensed data are stored in the data latch unit 245 in response to the control signals SEN2 and SEP2.

Thereafter, when an interval t5 starts, the voltage level of the plate line PL is inactivated to 'low', and the sub bit line selecting signal SBSW2 is activated to the pumping voltage VPP level. Then, the sub bit line pull-down signal SBPD is activated to 'high', and the voltage level of the sub bit line SBL becomes the ground level. As a result, the main bit line MBL is activated to 'high'.

In an interval t6, if a high voltage is applied as the sub bit line pull-up signal SBPU and the sub bit line selecting signal SBSW2 is pumped, the voltage level of the sub bit line SBL rises to the pumping voltage VPP level. As a result, high data (Hidden "1") are written in all cells connected to the activated word line WL regardless of external data. The write data applied through the local data bus 300 are stored in the data latch unit 34 in response to the write column selecting signal W_Yi<n>.

In an interval t7, data "0" is written. In the interval t7, if the write enable signal /WE and the write control signals WDN and UVDP are activated, data stored in the data latch unit 245 are transmitted to the main bit line MBL. Then, data of the main bit line MBL are transmitted to the sub bit line SBL in response to the sub bit line selecting signal SBSW1, and written in the cell. Here, if the data of the sub bit line SBL is 'high', the data (Hidden "1") written in the interval t6 are maintained. However, if the data of the sub bit line SBL is 'low', low data are written in the corresponding cell.

After data are written, the word line WL is inactivated earlier than the plate line PL for a predetermined time in an interval t8.

Figure 10:
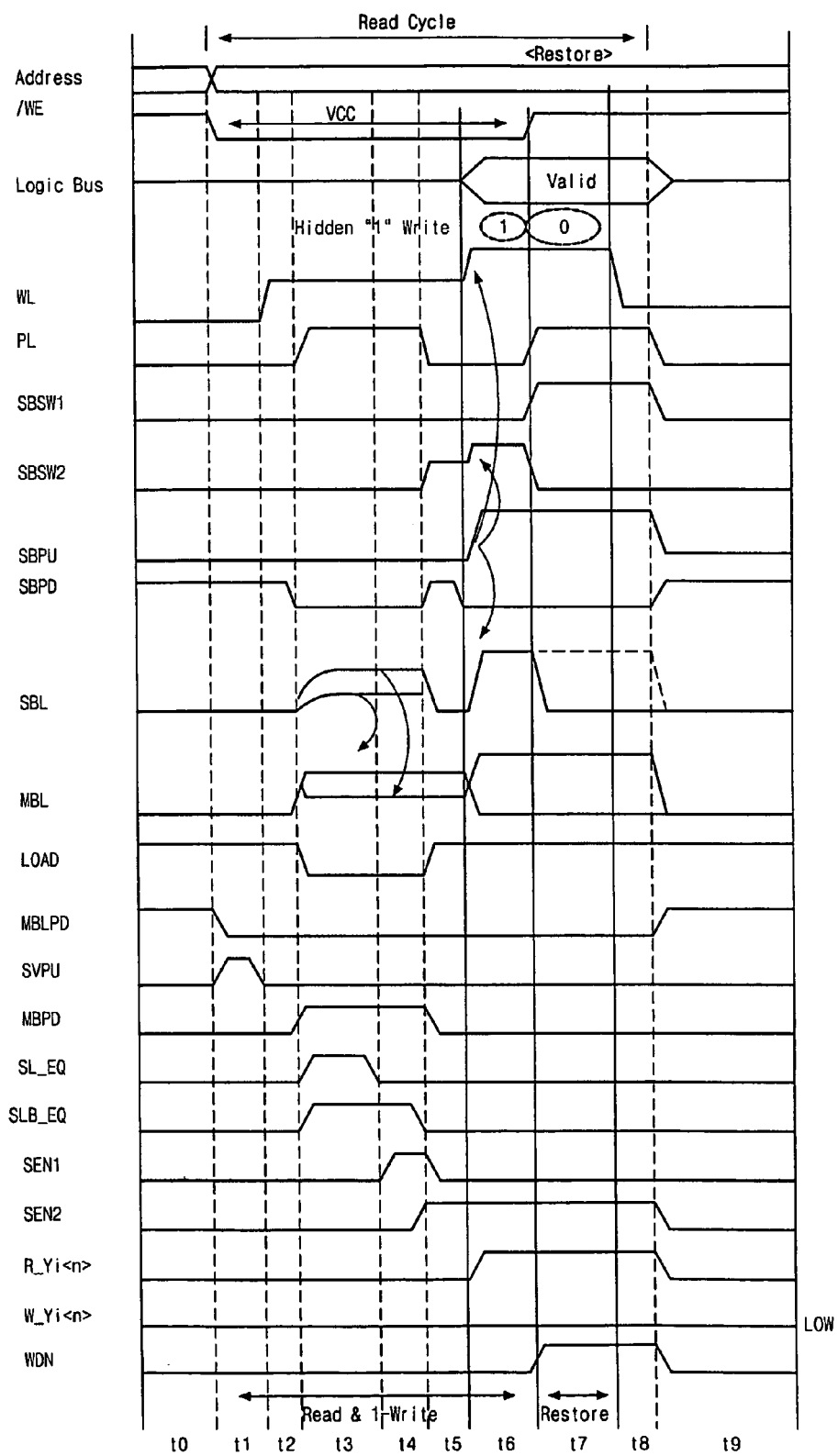
FIG. 10 is a timing diagram illustrating the read operation of the nonvolatile ferroelectric memory device according to an embodiment of the present invention.

FIG. 10 is a timing diagram illustrating the read operation of the nonvolatile ferroelectric memory device according to an embodiment of the present invention.

In the read mode, the write enable signal /WE is maintained at the power voltage level.

The procedure for writing data "1" in a selected cell after sensing data of the selected cell in intervals t0.about.t6 is the same as that of FIG. 9.

In the interval t6, if the read column selecting signal R_Yi<n> is activated, the data stored in the data latch unit 245 are transmitted to the local data bus 300.

After the sensing operation is completed, if the write control signal WDN is activated in an interval t7, the data stored in the data latch unit 245 are transmitted to the main bit line MBL for restoration. Here, the write column selecting signal W_Yi<n> is maintained at the low level so that the data inputted through the local data bus 300 are not written in the cell but the read data stored in the data latch unit 245 are restored in the cell.

After the restoration operation is completed, the word line WL is inactivated earlier than the plate line PL for a predetermined time.

As discussed earlier, in a nonvolatile ferroelectric memory device according to an embodiment of the present invention, a sensing voltage of a main bit line is changed up and down on a basis of a predetermined sensing level depending on cell data after a pull-up voltage of the main bit line is regulated to sensing level when data are sensed. Additionally, a data bus which is divided into a local data bus and a global data bus transmits the sensed data, thereby improving the sensing speed and the sensing margin.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device comprising:
a plurality of cell array blocks each comprising a dummy main bit line and a cell array having a hierarchical bit line architecture where a sensing voltage of a main bit line is induced depending on a sensing voltage of cell data transmitted to a sub bit line;
a sensing voltage pull-up regulating unit configured to compare a voltage of the dummy main bit line with a sensing level, and to generate a sensing voltage pull-up signal for regulating pull-up voltages of the dummy main bit line and the main bit line, so as to set a pull-up voltage of the main bit line to a predetermined sensing level when a sensing operation starts;
a plurality of sense amplifiers for sensing the cell data by comparing the sensing voltage of the main bit line with the sensing level when data are sensed to sense the cell data;
a main amplifier unit for amplifying data sensed in the plurality of sense amplifiers and outputting the sensed data to a data buffer; and
a data bus for connecting the plurality of sense amplifiers to the main amplifier unit and transmitting read or written data.

2. The device according to claim 1, wherein the plurality of sense amplifiers correspond one by one to the cell array blocks, and are positioned at one side of the cell array blocks.

3. The device according to claim 2, wherein the data bus comprises:
a plurality of local data buses corresponding one by one to the plurality of sense amplifiers and positioned at the other side of the plurality of sense amplifiers, and for receiving read data sensed from the plurality of sense amplifiers and transmitting write data to the plurality of sense amplifiers;
a global data bus shared by the plurality of local data buses and for connecting the local data buses to the main amplifier unit; and
a plurality of data bus switch arrays for selectively connecting the plurality of local data buses to the global data bus.

4. The device according to claim 1, wherein the sensing voltage pull-up regulating unit comprises:
a dummy sensing voltage pull-down unit for pulling down the voltage of the dummy main bit line in response to a main bit line pull-down signal when the sensing operation starts;
a pull-up control unit for generating the sensing voltage pull-up signal in response to the main bit line pull-down signal and the voltage of the dummy main bit line; and
a dummy sensing voltage pull-up unit for pulling up the dummy main bit line when the sensing voltage pull-up signal is activated.

5. The device according to claim 4, wherein the pull-up control unit activates the sensing voltage pull-up signal when a voltage level of the dummy main bit line is lower than the sensing level and the pull-up control unit inactivates the sensing voltage pull-up signal when the voltage level of the dummy main bit line reaches the sensing level while the main bit line pull-down signal is pulled down.

6. The device according to claim 5, wherein the pull-up control unit pulls up the voltage of the dummy main bit line to a power voltage when the sensing voltage pull-up signal is inactivated.

7. The device according to claim 3, wherein each of the plurality of sense amplifiers are connected corresponding one by one to the main bit line and for transmitting the cell data sensed in response to a column selecting signal to the plurality of local data buses.

8. The device according to claim 7, wherein each of the plurality of sense amplifiers comprises:
- a sensing voltage pull-up unit for pulling up the main bit line when the sensing voltage pull-up signal is activated;
- a sensing voltage pull-down unit for pulling down the main bit line in response to the main bit line pull-down signal when a sensing operation starts;
- a single-ended amplifier unit for sensing the cell data by comparing the voltage of the main bit line with the sensing level in response to a first sensing control signal;
- a data latch unit for storing cell data sensed in the single-ended amplifier unit or data applied through the plurality of local data buses in response to a second sensing control signal;
- a voltage equivalent unit for equalizing voltages of both ends of the data latch unit with the voltage of the main bit line before the second sensing control signal is activated;
- a write driving unit for transmitting data stored in the data latch unit to the main bit line in response to a write control signal;
- a write selecting unit for transmitting data applied from the plurality of local data buses to the data latch unit in response to a write column selecting signal; and
- a read selecting unit for transmitting data stored in the data latch unit to the plurality of local data buses in response to a read column selecting signal.

9. The device according to claim 1, wherein the dummy main bit line has the same load condition as that of the main bit line.

* * * * *